US006459199B1

(12) United States Patent
Kido et al.

(10) Patent No.: US 6,459,199 B1
(45) Date of Patent: Oct. 1, 2002

(54) MULTICOLOR ORGANIC EL ELEMENT HAVING PLURALITY OF ORGANIC DYES, METHOD OF MANUFACTURING THE SAME, AND DISPLAY USING THE SAME

(75) Inventors: Junji Kido, Kitakatsuragigun (JP); Naohiko Hukuoka, Koube (JP); Takashi Takeda, Koube (JP)

(73) Assignee: Chemipro Kasei Kaisha, Limited, Koube (JP)

( * ) Notice: Subject to any disclaimer, the term of this patent is extended or adjusted under 35 U.S.C. 154(b) by 0 days.

(21) Appl. No.: 09/171,966

(22) PCT Filed: May 14, 1997

(86) PCT No.: PCT/JP97/01626

§ 371 (c)(1),
(2), (4) Date: Oct. 30, 1998

(87) PCT Pub. No.: WO97/43874

PCT Pub. Date: Nov. 20, 1997

(30) Foreign Application Priority Data

May 15, 1996 (JP) .............................. 8-144948

(51) Int. Cl.[7] ........................... H05B 33/00; H05B 33/18
(52) U.S. Cl. .......................................... 313/504; 438/35
(58) Field of Search ................................ 313/504, 505, 313/506, 500; 428/690, 503, 917; 445/24; 438/34, 35, 99

(56) References Cited

U.S. PATENT DOCUMENTS

| 5,294,870 A | * | 3/1994 | Tang et al. | 313/504 |
| 5,409,783 A | * | 4/1995 | Tang et al. | 313/501 |
| 5,683,823 A | * | 11/1997 | Shi et al. | 428/690 |
| 5,736,754 A | * | 4/1998 | Shi et al. | 257/89 |
| 5,792,561 A | * | 8/1998 | Whang et al. | 428/457 |
| 5,844,535 A | * | 12/1998 | Itoh et al. | 345/92 |
| 6,037,190 A | * | 3/2000 | Chao et al. | 438/35 |

FOREIGN PATENT DOCUMENTS

| EP | 0 373 582 A1 | 6/1990 | |
| EP | 0 388 768 A2 | 9/1990 | |
| JP | 58-196582 | * 11/1983 | ...................... 9/30 |
| JP | A-59-194393 | 11/1984 | |
| JP | A-60-75864 | 4/1985 | |
| JP | A-63-295695 | 12/1988 | |
| JP | A-2-88689 | 1/1990 | |
| JP | A-2-191694 | 7/1990 | |
| JP | A-2-196885 | 8/1990 | |
| JP | A-2-250292 | 10/1990 | |
| JP | A-2-252793 | 10/1990 | |
| JP | A-2-255789 | 10/1990 | |
| JP | A-2-289676 | 11/1990 | |

(List continued on next page.)

OTHER PUBLICATIONS

C.W. Tang et al.; "Organic Electroluminescent Diodes," Appl. Phys. Lett., vol. 51, No. 12, Sep. 1987, pp. 913–915.
J. Kido et al., "Single–Layer White Light–Emitting Organic Electroluminescent Devices Based On Dye–Dispersed Poly (N–Vinylcarbazole)," Appl. Phys. Lett., vol. 67, No. 16, Oct. 1995, pp. 2281–2283.
J. Kido et al., "White Light–Emitting Organic Electroluminescent Devices," Appl. Phys. vol. 63, 1994, pp. 1026–1029. (Japanese–language).
Nikkei Electronics, Jan. 29, 1996, (No. 654), pp. 99–103. (Japanese–language).

Primary Examiner—Nimeshkumar D. Patel
Assistant Examiner—Karabi Guharay
(74) Attorney, Agent, or Firm—Oliff & Berridge, PLC

(57) ABSTRACT

A multicolor organic EL element having a light emitting layer containing at least two organic dyes that can act as light emitting center (luminescence center), wherein at least one of said organic dyes is modified so as to change the colors of the light emitted from the element, and a method for manufacturing the element, and a display using the element.

2 Claims, 7 Drawing Sheets

FOREIGN PATENT DOCUMENTS

| | | | | |
|---|---|---|---|---|
| JP | 3-77922 | * 4/1991 | ............... | 1/136 |
| JP | A-3-231970 | 10/1991 | | |
| JP | A-3-296595 | 12/1991 | | |
| JP | A-4-96990 | 3/1992 | | |
| JP | 4-74895 U | 6/1992 | | |
| JP | A-4-255692 | 9/1992 | | |
| JP | A-5-9470 | 1/1993 | | |
| JP | A-5-17764 | 1/1993 | | |
| JP | A-5-202011 | 8/1993 | | |
| JP | A-6-25659 | 2/1994 | | |
| JP | A-6-49079 | 2/1994 | | |
| JP | A-6-88072 | 3/1994 | | |
| JP | A-6-92947 | 4/1994 | | |
| JP | A-6-100857 | 4/1994 | | |
| JP | A-6-107648 | 4/1994 | | |
| JP | A-6-132080 | 5/1994 | | |
| JP | A-6-145146 | 5/1994 | | |
| JP | A-6-203963 | 7/1994 | | |
| JP | A-6-206865 | 7/1994 | | |
| JP | A-6-207170 | 7/1994 | | |
| JP | A-6-215874 | 8/1994 | | |
| JP | A-6-279322 | 10/1994 | | |
| JP | A-6-279323 | 10/1994 | | |
| JP | A-6-293778 | 10/1994 | | |
| JP | A-7-97355 | 4/1995 | | |
| JP | A-7-101911 | 4/1995 | | |
| JP | A-7-126225 | 5/1995 | | |
| JP | A-7-126226 | 5/1995 | | |
| JP | A-7-145116 | 6/1995 | | |
| JP | A-7-157473 | 6/1995 | | |
| JP | A-7-179394 | 7/1995 | | |
| JP | A-7-188130 | 7/1995 | | |
| JP | A-7-224012 | 8/1995 | | |
| JP | A-7-228579 | 8/1995 | | |
| JP | A-7-278124 | 10/1995 | | |
| JP | A-8-22557 | 1/1996 | | |
| JP | A-8-40995 | 2/1996 | | |
| JP | A-8-40996 | 2/1996 | | |
| JP | A-8-40997 | 2/1996 | | |
| JP | A-8-48656 | 2/1996 | | |
| JP | A-8-81472 | 3/1996 | | |
| JP | A-8-259938 | 10/1996 | | |

* cited by examiner

MULTICOLOR ORGANIC EL ELEMENT HAVING PLURALITY OF ORGANIC DYES, METHOD OF MANUFACTURING THE SAME, AND DISPLAY USING THE SAME

FIELD OF THE INVENTION

The present invention relates to an organic EL element used as a planar light source or a display element, a method for manufacturing the same, and a display using the same.

PRIOR ART

Organic EL elements having a luminescent (light emitting) layer composed of an organic film, which can provide large-area, low-voltage display elements, are currently attracting a great deal of attention. Since an element structure having organic laminated layers of differing carrier transportation capabilities can be effectively used to improve the efficiency of such an element, an element has been proposed in which the positive-hole transfer layer and the luminous electron transportation layers comprise low-molecular aromatic amine and an aluminum chelate complex, respectively [C. W. Tang, Appl. Phys. Lett., 51, p. 913 (1987)]. With an applied voltage of 10 V or less, this element can provide high brightness of 1,000 cd/m$^2$, which is sufficient for practical use.

At present, arbitrary organic dyes are used as a luminescence center (a light emitting center) to obtain arbitrary luminescent colors ranging from blue to red in the visible region. Furthermore, an RGB multicolor display (a display element) can be obtained by closely arranging picture elements having luminescent colors of red (R), green (G), and blue (B), which are the primary colors, in parallel on the same substrate.

However, in order to use a vacuum evaporation method to produce a multicolor display, particularly an RGB multicolor display with different luminescent colors as described above, picture elements with different luminescent colors must be sequentially produced on the same substrate using a shadow mask. Thus, compared to monochromatic luminescent picture elements, the above picture elements require a large amount of time and labor for production due to their small size, making them unsuitable for use in the manufacture of high-definition displays.

To solve these problems, Kido et al. have proposed an emitting element section that is adapted for white that is prepared in a contact print, but which can provide multiple colors by combining the element with a color filter, obviating an arrangement of EL elements over very small intervals or a preparation of elements having different luminescent colors [J. Kido, K. Nagai, Appl. Phys., Vol. 63, pp. 1026 to 1029 (1994)]. This method puts a color filter between a transparent substrate and a transparent electrode of material such as indium-tin oxide (ITO) in order to modulate emissions from an organic luminescent layer sandwiched between the ITO and a rear electrode.

A group at Idemitsu Kosan Co. has also proposed a combination of a blue-emitting element and a color-converting layer, in order to convert blue into green or red to arrange RGB picture elements (Nikkei Electronics, January, pp. 102, 1996). This method inserts a fluorescent color-converting layer between the ITO and the transparent substrate to convert blue light generated In the luminescent layer into green and red light.

Despite their simplicity, arrangements based on the color filter or blue color-converting methods are inefficient, due to photo-absorption losses resulting from the color filter or to conversion losses resulting from the color-converting layer.

OBJECT OF THE INVENTION

This invention provides a solution to these problems, with the objective of creating an organic EL element that can provide high-luminous efficiency and is capable of easily providing multiple colors. The objectives also include a manufacturing method of such elements and the creation of a display incorporating such elements.

DISCLOSURE OF THE INVENTION

To attain said objects, an organic EL element according to this invention uses two or more types of organic dyes that can act as light emitting centers. In attempting to manufacture this element, we discovered that an organic light emitting dye layer may be partially irradiated with electromagnetic radiation (light) to modify one or more dye types through photo-oxidation or photolysis to keep the dyes from functioning fully as light emitting centers, or to change the colors of light emitted, thereby allowing the production of differing colors at irradiated and non-irradiated portions. The electromagnetic radiation used in this invention has a vacuum frequency of about $10^{-17}$ to $10^5$ m and includes the γ-rays, X-rays, ultraviolet radiation, visible radiation, and infrared radiation and is in particular preferably ultraviolet radiation or visible radiation.

A first aspect of this invention involves a multicolor organic EL element, characterized in that the element includes a light emitting layer (a luminescent layer) containing at least two or more kinds of organic dyes acting as light emitting centers (luminescence centers) in which at least one of the organic element kinds is modified to change the colors of the light emitted by the element. The light emitting layer may consist of one or many layers.

A second aspect of this invention involves a method for manufacturing a multicolor organic EL element, involving the formation of a light emitting layer containing at least two kinds of organic dyes acting as light emitting centers, and the partial irradiation of the light emitting layer with electromagnetic radiation to modify at least one of these kinds of organic dye.

A third aspect of this invention involves a method for manufacturing a multicolor organic EL element having one or more light emitting layers containing organic elements acting as light emitting centers, characterized in that any light emitting layer is entirely or partially irradiated with electromagnetic radiation to modify at least one of these kinds of organic dye present within the irradiated area.

A fourth aspect of this invention involves a multicolor organic EL element, characterized in that in an organic electroluminescence element having a light emitting layer composed of at least one organic compound layer, the light emitting layer contains three or more kinds of organic dyes capable of acting as light emitting centers and emitting blue, green, and red light; and in that at least one of these kinds of organic dye is modified to change the color of the light emitted from the corresponding picture element.

PREFERRED MODES FOR CARRYING OUT THE INVENTION

Figure 7:
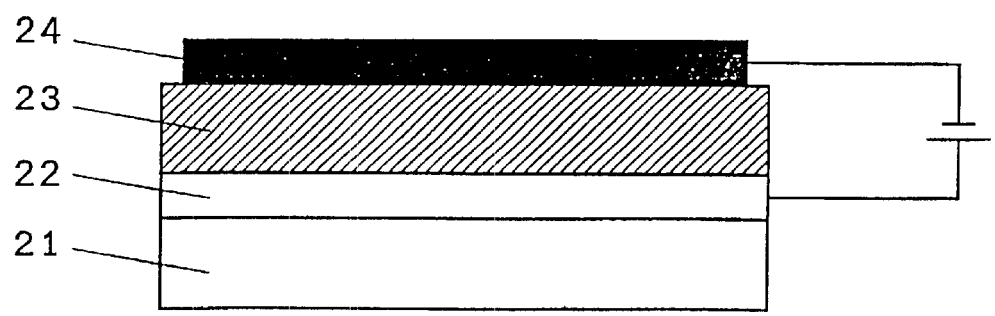
FIG. 7 is a sectional view of an organic EL element according to Embodiment 4.

FIG. 7 is a schematic diagram showing one embodiment (Embodiment 4) of an organic EL element according to this invention. A glass substrate (a transparent substrate) 21 is sequentially laminated with a transparent electrode constituting a positive electrode, for example an ITO electrode 22; a light emitting layer 23 containing three or more kinds of light emitting dyes; and a rear electrode 24 constituting a negative electrode.

This particular lamination sequence is only one of several possible configurations; other possible configurations include positive electrode/positive hole transporting layer/ light emitting layer/negative electrode, positive electrode/ light emitting layer/electron transporting layer/negative electrode, positive electrode/positive hole transporting layer/light emitting layer/electron transporting layer/ negative electrode, positive electrode/positive hole injection layer/light emitting layer/negative electrode, positive electrode/positive hole injection layer/positive hole transporting layer/light emitting layer/negative electrode, and positive electrode/positive hole injection layer/positive hole transporting layer/light emitting layer/electron transporting layer/negative electrode.

Figure 8:
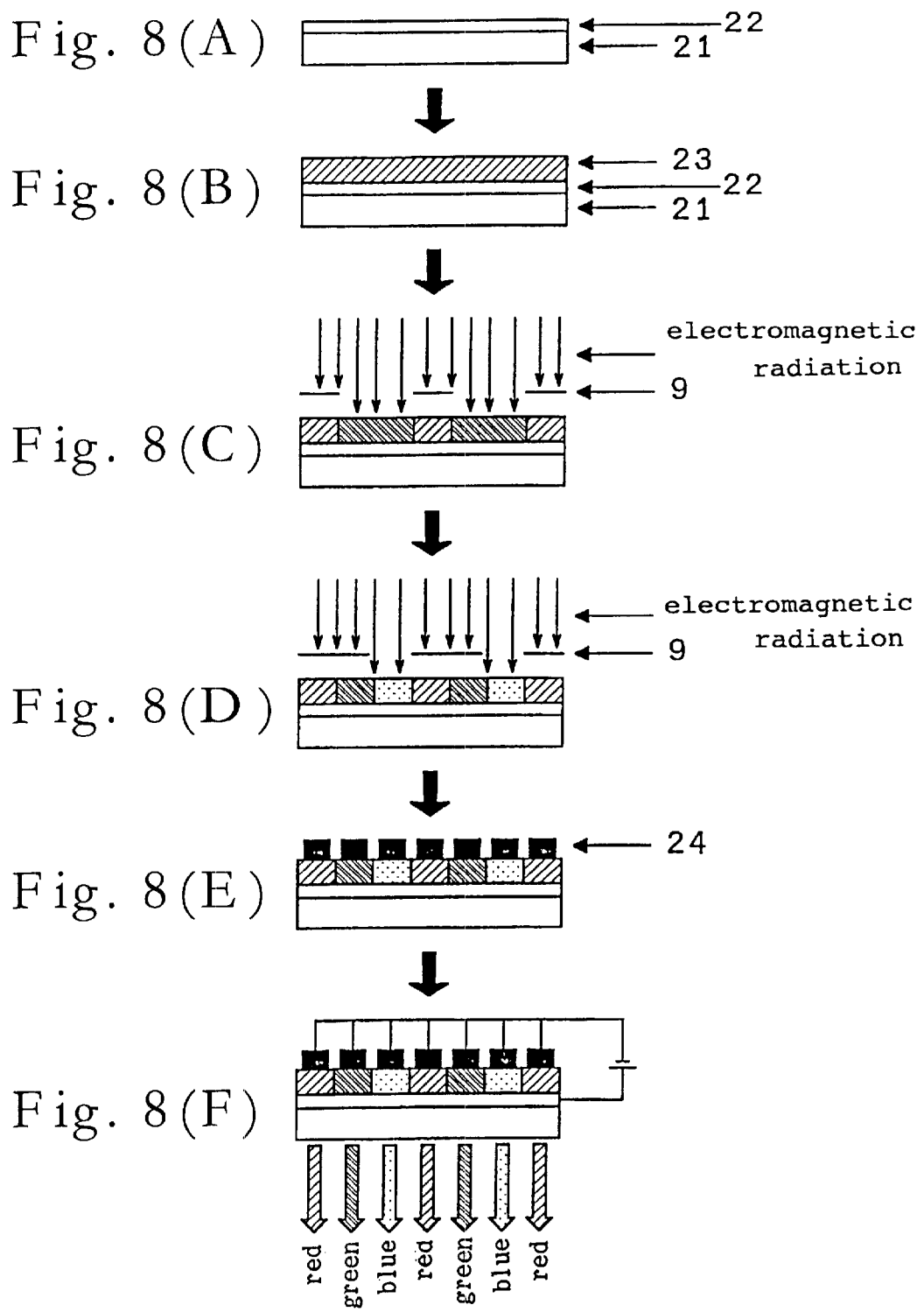
FIG. 8 is a sectional view illustrating an organic EL element manufacturing process according to Embodiment 4 for each of steps A to F.

FIG. 8 shows the manufacturing processes for a multicolor organic EL element.

This invention irradiates with electromagnetic radiation one or more light emitting layers containing organic dyes capable of acting as light emitting centers, but any one or all of the layers may be irradiated. In this case, (a) the irradiation strength for the overall surface may be varied (for example, layers are exposed through a filter having locally varying transmittance, as in negative film, or the layers are scanned by varying the strength of light emitted from a fine light source); or (b) the layers are partially irradiated using masking. Partial exposure includes, for example, contact exposure using a photo-mask and projection exposure (that is, partial exposure using light focused by a lens or light emitted from a fine light source, or using such light with a photo-mask).

In an organic EL element, positive holes are injected into an organic layer from a positive electrode, namely a positive hole injection electrode, while electrons are injected into the organic layer from a negative electrode, namely an electron injection electrode. In the organic layer constituting a light emitting layer, both carriers are recombined to generate excitons, or excited molecules. By dispersing a very small amount of organic dye in the light emitting layer as dopant (guest), with low excitation energy compared to a compound (host) used for the light emitting layer, the transfer of excitation energy enables the emission of the host to be modulated into one from the dopant dye. If multiple types of dopant dyes are used, the density of each dopant dye can be adjusted to control the colors of the light emitted from the element (J. Kido and two others, Appl. Phys. Lett. 67, pp. 2281, 1995).

This invention provides an element having two or more kinds of organic dyes that can function as multiple types of light emitting centers in which any organic dye is partially irradiated with electromagnetic radiation, such as ultraviolet or visible light, degrading only a specific organic dye in order to modulate the colors of the light emitted from the irradiated portion. In this way, a full-color display can be obtained by providing all picture elements on the same substrate with red, green, and blue dyes, and using electromagnetic radiation to form red, green, and blue emitting picture elements.

According to this invention, a host compound dispersing dopant dyes that can be used for an organic EL element emitting two or several colors offers an unlimited array of the colors of the emitted light. The carrier transporting capability of the host compound is not limited and may transport electrons and/or positive holes.

The general host compound may be composed of anthracene, naphthalene, phenanthrene, pyrene, tetracene, coronene, chrysene, fluoroscein, perylene, phthaloperylene, naphthaloperylene, perynone, phthaloperynone, naphthaloperynone, diphenylbutadiene, tetraphenylbutadiene, coumarin, oxadiazole, aldadine, bisbenzoxazoline, bisstyryl, pyrazine, cyclopentadiene, oxine, aminoquinoline, imine, diphenylethylene, vinylanthracene, diaminocarbazole, pyrane, thiopyran, polymethyne, merocyanine, imidazole chelated oxynoid compounds, quinacridone, rubrene, or their derivatives.

An optical whitening agent composed of benzoxazole, benzothiazole, or benzimidazole is disclosed in Japanese Patent Application Laid Open No. 59-194393, among others. The agents may include benzoxazoles such as 2,5-bis (5,7-di-t-pentyl-2-benzoxazolyl)-1,3,4-thiazole, 4,4'-bis(5, 7-t-pentyl-2-benzoxazolyl)stilbene, 4,4'-bis(5,7-di-t-(2-methyl-2-butyl)-2-benzoxazolyl)stilbene, 2,5-bis(5,7-di-t-pentyl-2-benzoxazolyl)thiophene, 2,5-bis[5-(α,α-dimethyl-benzyl)]-2-benzoxazolyl]thiophene, 2,5-bis[5,7-di-(2-methyl-2-butyl)-2-benzoxazolyl]-3,4-diphenylthiophene, 2,5-bis(5-methyl-2-benzoxazolyl)thiophene, 4,4'-bis(2-benzoxazolyl)biphenyl, 5-methyl-2-{2-[4-(5-methyl-2-benzoxazolyl)phenyl]vinyl}benzoxazole, 2-[2-(4-chlorophenyl)vinyl]naphtho(1,2-d)oxazole; benzothiazole such as 2,2'-(p-phenylenedivinylene)-bisbenzothiazole; and benzimidazoles such as 2-{2-[4-(2-benzoimidazolyl) phenyl]vinyl}benzimidazole and 2-[2-(4-carboxyphenyl) vinyl]benzimidazole.

A metallic-chelated oxanoid compound is disclosed in Japanese Patent Application Laid Open No. 63-295695, among others. Representative examples include 8-hydroxyquinoline metallic complexes such as tris(8-quinolinol)aluminum, bis(8-quinolinol)magnesium, bis [benzo(f)-8-quinolinol]zinc, bis(2-methyl-8-quinolinorate) aluminum oxide, tris(8-quinolinol)indium, tris(5-methyl-8-quinolinol)aluminum, 8-quinolinol lithium, tris(5-chloro-8-quinolinol)gallium, bis (5-chloro-8-quinolinol)calcium, and poly[zinc (II)-bis-(8-hydroxy-5-quinolinonyl)methane]; and dilithiumepinedolidione.

The distyrylbenzene compound is disclosed in EP Patent No. 0373582, among others. Representative examples include 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene, and 1,4-bis(2-methylstyryl)-2-ethylbenzene.

The distyrylpyrazine derivative disclosed in Japanese Patent Application Laid Open No. 2-252793 may also be used as an organic dye. Representative examples include 2,5-bis(4-methystyryl)pyrazine, 2,5-bis(4-ethylstyryl) pyrazine, 2,5-bis[2-(1-naphthyl)vinyl]pyrazine, 2,5-bis(4-methoxystyryl)pyrazine, 2,5-bis[2-(4-biphenyl)vinyl] pyrazine, and 2,5-bis[2-(1-pyrenyl)vinyl]pyrazine.

The dimethylidene derivative disclosed in EP Patent No. 388768 or Japanese Patent Application Laid Open No. 3-231970 may be used as material for the organic light emitting layer. Representative examples include 1,4-phenylenedimethylidene, 4,4'-phenylenedimethylidene, 2,5-xylirenedimethylidene, 2,6-naphthylenedimethylidene, 1,4-biphenylenedimethylidene, 1,4-p-terephenylenedimethilidene, 9,10-anthracenediildimethylidene, 4,4'-(2,2-di-t-butylphenylvinyl)biphenyl, 4,4'-(2,2-diphenylvinyl)biphenyl, and their derivatives.

Such derivatives include the silanamine derivatives disclosed in Japanese Patent Applications Laid Open No. 6-49079 and No. 6-293778, the multifunctional styryl compounds disclosed in Japanese Patent Applications Laid Open No. 6-279322 and 6-279323, the oxadiazole derivatives disclosed in Japanese Patent Applications Laid Open No. 6-107648 and No. 6-92947, the anthracene compounds disclosed in Japanese Patent Application Laid Open No. 6-206865, the oxynate derivastives disclosed in Japanese Patent Application Laid Open No. 6-145146, the tetraphenylbutadiene compounds disclosed in Japanese Patent Application Laid Open No. 4-96990, the organic trifunctional compounds disclosed in Japanese Patent Application Laid Open No. 3-296595, the coumarin derivatives disclosed in Japanese Patent Application Laid Open No. 2-191694, the perylene derivatives disclosed in Japanese Patent Application Laid Open No. 2-196885, naphthalene derivatives disclosed in Japanese Patent Application Laid Open No. 2-255789, the phthaloperynone derivatives disclosed in Japanese Patent Application Laid Open No. 2-289676, No. 2-88689 and the styrylamine derivatives disclosed in Japanese Patent Application Laid Open No. 2-250292.

If the element is used in an R (red), G (green), and B (blue) multicolor display, for example a full-color display, it must be able to provide the primary colors of the emitted light of red, green, and blue. Thus, an organic compound used as a host material must emit a blue light or a luminescent light having a higher energy level than blue light (near ultraviolet rays). The emission spectrum of such light has a peak wavelength of 370 to 500 nm.

The organic compound for such a full color display must provide luminescent light ranging from near-ultraviolet light to blue-green light and must be able to transport carriers. In this case, this organic compound may transport electrons and/or positive holes. An organic compound for a host meeting these requirements includes a metallic complex having as a ligand at least one of polycyclic compounds such as p-terphenyl and quaterphenyl and their derivatives; condensed polycyclic carbohydrates such as naphthalene, tetracene, pyrene, coronene, chrysene, anthracene, diphenylanthracene, naphthacene, and phenanthrene, and their derivatives; condensed heterocyclic compounds such as phenanthroline, vasophenanthroline, phenantolidine, acridine, quinoline, quinoxaline, and phenadine, and their derivatives; and perylene, phthaloperylene, naphthaloperylene, perynone, phthaloperynone, naphthaloperynone, diphenylbutadiene, tetraphenylbutadiene, oxadiazole, triazole, ardadine, bisbenzoxazoline, bisstyryl, pyrazine, cyclopentadiene, vinylanthracene, and carbazole, and their derivatives; and 8-quinolinorate and its derivative.

The oxadiazole disclosed in Japanese Patent Applications Laid Open No. 5-202011, No. 7-179394, No. 7-278124, and No. 7-228579, the triadine disclosed in Japanese Patent Application Laid Open No. 7-157473, the stilbene and distyrylallylene derivatives disclosed in Japanese Patent Application Laid Open No. 6-203963, the styryl derivatives disclosed in Japanese Patent Applications Laid Open No. 6-132080 and No. 6-88072, and the diolefine derivative disclosed in Japanese Patent Applications Laid Open No. 6-100857 and No. 6-207170. The distyrylbenzene compound is disclosed in, for example, EP Patent No. 0373582. Representative examples include 1,4-bis(2-methylstyryl) benzene, 1,4-bis(3-methystyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene, and 1,4-bis(2-methylstyryl)-2-ethylbenzene.

The distyrylpyrazine derivatives disclosed in Japanese Patent Application Laid Open No. 2-252793 can be used as a light emitting layer host material. Representative examples include 2,5-bis(4-methylstyryl) pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, and 2,5-bis[2-(1-pyrenyl)vinyl]pyrazine.

An optical whitening agent such as benzoxazole, benzothiazole, or benzimidazole may be used and is disclosed in Japanese Patent Application Laid Open No. 59-194393. Representative examples include benzoxazole such as 2,5-bis(5,7-di-t-pentyl-2-benzoxazolyl)-1,3,4-thiazole, 4,4'-bis(5,7-t-pentyl-2-benzoxazolyl)stilbene, 4,4'-bis[5,7-di(2-methyl-2-butyl)-2-benzoxazolyl]stilbene, 2,5-bis(5,7-di-t-pentyl-2-benzoxazolyl)thiophene, 2,5-bis[5-(α,α-dimethylbenzyl)]-2-benzoxazolyl)]thiophene, 2,5-bis[5,7-di-(2-methyl-2-butyl)-2-benzoxazolyl]3,4-diphenylthiophene, 2,5-bis(5-methyl-2-benzoxazolyl) thiophene, 4,4'-bis(2-benzoxazolyl)biphenyl, 5-methyl-2-{2-[4-(5-methyl-2-benzoxazolyl)phenyl] vinyl}benzoxazole, 2-[2-(4-chlorophenyl)vinyl]naphtho(1,2-d)oxazole; benzothiazole such as 2,2'-(p-phenylenedivinylene)-bisbenzothiazole; and benzimidazole such as 2-{2-[4-(2-benzimidazolyl)phenyl] vinyl}benzimidazole and 2-[2-(4-carboxyphenyl)vinyl] benzimidazole.

Other materials for an organic light emitting layer include the dimethylidene derivatives disclosed in EP Patent No. 388768 and Japanese Patent Application Laid Open No. 3-231970. Representative examples include 1,4-phenylenedimethylidene, 4,4'-phenylenedimethylidene, 2,5-xylylenedimethylidene, 2,6-naphthylenedimethylidene, 1,4-biphenylenedimethylidene, 1,4-p-terephenylenedimethilidene, 9,10-anthracenediyldimethylidene, 4,4'-(2,2-di-t-butylphenylvinyl)biphenyl, 4,4'-(2,2-diphenylvinyl) biphenyl, and their derivatives, the silanamine derivatives disclosed in Japanese Patent Applications Laid Open No. 6-49079 and No. 6-293778, the multifunctional styryl compounds disclosed in Japanese Patent Applications Laid Open No. 6-279322 and No. 6-279323, the oxadiazole derivatives disclosed in Japanese Patent Applications Laid Open No. 6-107648 and No. 6-92947, the anthracene compounds disclosed in Japanese Patent Application Laid Open No. 6-206865, the oxynate derivatives disclosed in Japanese Patent Application Laid Open No. 6-145146, the tetraphenylbutadiene compounds disclosed in Japanese Patent Application Laid Open No. 4-96990, the organic trifunctional compounds disclosed in Japanese Patent Application Laid Open No. 3-296595, the coumarin derivatives disclosed in Japanese Patent Application Laid Open No. 2-191694, the perylene derivatives disclosed in Japanese Patent Application Laid Open No. 2-196885, the naphthalene derivatives disclosed in Japanese Patent Application Laid Open No. 2-255789, the phthaloperynone derivatives disclosed in Japanese Patent Application Laid Open No. 2-289676 and No. 2-88689, and the styrylamine derivatives disclosed in Japanese Patent Application Laid Open No. 2-250292.

Organic compounds that may be used as potential light emitting layer host materials include the arylamine compounds, with the choice not limited to particular arylamine compounds, but preferably the arylamine compounds disclosed in Japanese Patent Applications Laid Open No. 6-25659, No. 6-203963, No. 6-215874, No. 7-145116, No. 7-224012, No. 7-157473, No. 8-48656, No. 7-126226, No. 7-188130, No. 8-40995, No. 8-40996, No. 8-40997, No. 7-126225, No. 7-101911, and No. 7-97355. These compounds include, for example, N,N,N',N'-tetraphenyl-4,4'-diaminophenyl, N,N'-diphenyl-N,N'-di (3-methylphenyl)-4,4'-diaminophenyl, 2,2-bis(4-di-p-tolylaminophenyl) propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminophenylether, 4,4'-bis (diphenylamino)quadriphenyl, 4-N,N-diphenylamino(2-diphenylvinyl)benzene, 3-methoxy-4'-N,N-diphenylaminostilbenzene, N-phenylcarbazole, 1,1-bis(4-di-p-trlaminophenyl)cyclohexane, 1,1-bis(4-di-p-triaminophenyl)-4-phenylcyclohexane, bis(4-dimethylamino-2-methylphenyl)-phenylmethane, N,N,N-tri (p-tolyl)amine, 4-(di-p-tolylamino)-4'-[4(di-p-tolylamino) styryl]stilbene, N,N,N',N'-tetra-p-tolyl-4,4-diamino-biphenyl, N,N,N'-tetraphenyl-4,4'-diamino-bipheyl N-pbenylcarbazole, 4,4'-bis[N-(1-naphthyl)-N-phenyl-amino]biphenyl, 4,4"-bis[N-(1-naphthyl)-N-phenyl-amino] p-terphenyl, 4,4'-bis[N-(2-naphtyl)-N-phenyl-amino] biphenyl, 4,4'-bis[N-(3-acenaphthenyl)-N-phenylamino] biphenyl, 1,5-bis[N-(1-naphthyl)-N-phenyl-amino]] naphthalene, 4,4'-bis[N-(9-anthryl)-N-phenylamino] biphenyl, 4,4"-bis[N-(1-anthryl)-N-phenylamino]p-terphenyl, 4,4'-bis[N-2-phenanthryl]-N-phenyl-amino] biphenyl, 4,4'-bis[N-(8-fluoranethenyl)-N-phenylamino] biphenyl, 4,4'-bis[2-pyrenyl]-N-phenylamino]biphenyl, 4,4'-bis[N-(2-perylenyl)-N-phenylamino]biphenyl, 4,4'-bis [N-(1-coronenyl)-N-phenyl-amino]biphenyl, 2,6-bis(di-p-tolylamino)naphthalene, 2,6-bis[di-(1-napbthyl)amino] naphthalene, 2,6-bis[N-(l-naphthyl)-N-(2-naphthyl)amino] naphthalene, 4,4"-bis[N,N-di(2-naphthyl)amino]terphenyl, 4,4'-bis{N-phenyl-N-[4-(1-naphthyl)phenyl] amino}biphenyl, 4,4"-bis[N-phenyl-N-(2-pyrenyl)amino] biphenyl, 2,6-bis[N,N-di(2-naphthyl)amino]fluorene, 4,4"-bis(N,N-di-p-tolylamino)terphenyl, and bis(N-1-naphthyl) (N-2-naphthyl) amine. Well-known organic compounds conventionally used to produce organic EL elements may be used, as required.

The above organic compounds may be dispersed in polymer, or polymerized; or a polymer such as poly (N-vinylcarbazole) or polysilane may be used.

The choice of dopant is not restricted, as long as the dopant is a fluorescent organic compound, including not only the above electron transporting materials, hole transporting materials, and light emitting materials, but also dyes such as coumarin derivatives, dicyanomethylenepyrane derivatives, dicyanomethylenethiopyrane derivative, fluoresceine derivatives, perylene derivatives, or porphyrin derivativesthat are well-known as laser dyes.

The organic compound used for the electron transporting layer may be In addition to the electron transporting organic compounds found in the light emitting-layer host materials described above, the matallic-chelate complex compounds disclosed in Japanese Patent Application Laid Open No. 63-295695, No. 8-22557, No. 8-81472, No. 5-9470, and No. 5-17764, particularly the matallic-chelate oxide compounds, preferably a metallic complex having as a ligand at least one of 8-quinolinorate such as tris (8-quinolinorate)aluminum, bis(8-quinolinor ate)magnesium, bis [benzo(f)-8-quinolinorate]zinc, bis(2-methyl-8-quinol inorate) aluminum, tris(8-quinolinorate)indium, tris(5-methyl-8-quinolinorate)aluminum, 8-quinolinoratelithium, tris(5-chloro-8-quinolinorate)gallium, and bis(5-chloro-8-quinolinorate)calcium, and their derivatives.

The positive hole transporting layer may comprise one of the positive hole transporting organic compounds such as arylamine, included in the above light emitting-layer host materials. The positive hole-transporting layer may also comprise one the above organic compounds dispersed in polymer, or polymerized. Alternatively, this layer may comprise π conjugate polymer such as polyparaphenylenevinylene or its derivative or a polyalkylthiophene derivative, positive hole transporting non-conjugate polymers represented by poly (N-vinylcarbazole), or sigma conjugate polymers such as polysilane.

The material used for the positive hole injection layer is left unrestricted, and may comprise metallic phthalocyanine such as copper phthalocyanine, non-metallic phthalocyanine, carbon membranes, or conductive polymers such as polyaniline. Furthermore, Lewis acid is allowed to act on the above arylamine as an oxidizing agent to form radical cations, which may then be used as a positive hole injection layer.

The electromagnetic wave irradiation method (or exposure method) according to this invention may be either of the contact or projection exposure methods, using a photo-mask, or another well-known exposure method, such as laser beam scanning.

The electromagnetic radiation according to this invention may be visible light or light with appropriate energy levels, such as ultraviolet radiation, X-rays, or γ-rays.

The various organic films used in this invention may be obtained using well-known film-forming methods, such as the vacuum evaporation method, the sputtering method, and the application method.

In the multicolor organic EL element according to the fourth aspect of this invention, picture elements that are modified so as to emit three luminescent colors including red, green, and blue are arranged in a certain pattern, and the red, green, and blue dots may be arranged in a certain pattern or laminated. For example, an electrode, a red organic layer, an electrode, a green organic layer, an electrode, a blue organic layer, and an electrode must be laminated in this order, thereby requiring different process steps for the respective layers. However, the layers may be formed by arranging the three light-emitting sources for red, green, and blue In a certain pattern and providing electrodes over them. The latter method has the advantage of requiring a very small number of process steps.

In an element in which pixels each composed of R, G, and B are arranged in parallel in the horizontal direction, one of the two electrodes acts as a signal electrode, while the other acts as a scanning electrode. These electrodes are driven in a time-sharing manner to form images, thereby providing a so-called passive matrix RGB dot-matrix, or full-color display.

Further, each picture element of a RGB multicolor element is added active elements such as a transistor to perform a memory-function, thereby providing an active matrix RGB dot-matrix, or full-color display.

According to this invention, during an element manufacturing process, an organic layer having two or more kinds of dyes that can act as light emitting centers may be irradiated with light to degrade an arbitrary dye in order to modulate the corresponding luminescent color emitted by the element. Thus, partial irradiation enables a very simple arrangement of elements with different luminescent colors on the same substrate. This technique may be used for multicolor display elements and so on.

By arranging light emitting picture elements for the primary colors including red, green, and blue on a substrate as one pixel, this arrangement may be used as a multicolor or full-color display.

EMBODIMENTS

This invention is described below exemplified in several embodiments, but the invention is not limited to these particular embodiments.

The polymer used In these embodiments of the invention was synthesized in the following manner. The reaction formula for this polymer is shown in Formula 1.

(1) One hundred and twenty (120) ml of DMSO as a solvent was added to 10.0 g of N,N'-diphenylbenzidine (29.7 mmol), 8.38 g of p-fluoronitrobenzene (59.4 mmol), and 4.5 g of cesium fluoride (29.7 mmol), and the mixture was stirred in a nitrogen atmosphere at 100° C. for 24 hours. Following reaction, the mixture was poured with stirring into 2500 ml of cold water to obtain crude crystals of N,N'-diphenyl-N-(4-nitrophenyl)-1,1'-biphenyl-4,4'-diamine (NTPD). Subsequently, the mixture was dried for 12 hours in a vacuum at 60° C.

(2) Fourteen point two (14.2) grams of NTPD (31.1 mmol), 12.7 g of iodobenze (62.2 mmol), 21.5 g of potassium carbonate (156 mmol), and 9.88 g of activated copper (156 mmol) were mixed, which was then stirred in a nitrogen atmosphere at 220° C. for 36 hours. Following reaction, the mixture was dissolved in 1,2-dichloroethane, then filtered to remove copper. An evaporator was used to remove 1,2-dichloroethane, and the column chromatography method (development solvents: 1,2-dichloroethane: n-hexane=1:1, Rf=0.52) was used to purify the mixture to obtain N,N'-diphenyl-N-(4-nitrophenyl)-N'-(phenyl)-1,1'-biphenyl-4,4'-diamine (NPTPD).

(3) One hundred and forty (140.0) ml of DMF was added to 3.50 g of NPTPD (9.19 mmol) and 1.83 g of 5% palladium/carbon to reduce the nitro group in a hydrogen atmosphere at room temperature and normal pressure. Following reaction, the mixture was filtered to remove the palladium/carbon, and the filtrate was poured into cold water (1800 ml) with stirring, thereby obtaining crude crystals of N,N'-diphenyl-N-(4-aminophenyl)-N'-(phenyl)-1,1'-biphenyl-4,4'-diamine (APTPD).

(4) Two point sixty three (2.63) grams of APTPD (5.04 mmol) and 0.51 g of triethylamine (5.04 mmol) were dissolved in 40 ml of benzene, and 0.79 g of methacrylic acid chloride (7.56 mmol) diluted in 5.0 ml of benzene was added dropwise to the mixture as the mixture was stirred at 10° C. The mixture was left to react for 36 hours. Following reaction, the mixture was filtered to remove triethylamine hydrochloride. The mixture was then washed, using 1N HCl, 1N NaOH, and water, in this order, and dried overnight over anhydrous magnesium sulfate. An evaporator was used to remove the solvent to obtain crude crystals of N-substituted methacrylamide containing triphenyldiamine (TPDMA). Subsequently, the column chromatography method (development solvent: 1,2-dichloroethane, Rf=0.50) was used to purify the crystal (yield: 74.4%, 2.14 g), and a solvent mixture of benzene and cyclohexane was used for recrystallization to obtain white needle-shaped crystals.

Yield: 38.5% (2.04 g); Melting point: 175.5 to 176.2° C.; IR (KBr, cm$^{-1}$: 3400, 1664, 1593 (CONH), 3000 (CH$_3$), 1637 (CH$_2$=C); $^1$H NMR (270 MHz, CDCl$_3$, TMS): δ (ppm)=2.0 (S, 3H, CH$_3$), 5.4 (S, 1H, CH$_2$), 5.8 (S, 1H, CH$_2$), 6.9–7.5 (m, 27H, Ar); Elemental analysis (as C$_{40}$H$_{33}$N$_3$O$_1$); Analyzed value: C, 84.23%, H, 6.08%, N, 7.06%; Calculated value: C, 84.03%, H, 5.82%, N, 7.35%.

(5) One point thirteen (1.13) g of TPDMA (1.98 mmol) and 0.0321 g of azoisobutylonitrile (AIBN) (0.198 mmol) as a starting agent were dissolved in 14.0 ml of benzene as a solvent in an eggplant-type flask with a stopcock. After freezing and de-airing, the mixture was left to react at 60° C. for 48 hours. Following reaction, the mixture was poured into methanol (1/20) to precipitate an N-substituted methacrylamide polymer (PTPDMA) containing triphenyldiamine. Precipitation was repeated five times to purify the mixture (benzene/methanol). The structure was checked using IR spectra, $^1$H NMR spectra, and elemental analysis. Polymerization reaction was confirmed through the loss of a peak based on protons in a double bond of δ (ppm)=5.4(S, 1H, CH$_2$) and 5.8 (S, 1H, CH$_2$) in $^1$H NMR.

Yield: 94.4% (1.07 g); Weight average molecular weight: 2.7×10$^4$ [DMF (LiBr), reduced polystyrene]; $^1$H NMR (270 MHz, CDCl$_3$, TMS): δ (ppm)=1.3 (S, 3H, CH$_3$), 2.1 (S, 2H, CH$_2$), 6.6–7.6 (m, 27H, Ar); Elemental analysis value (as C$_{40}$H$_{33}$N$_3$O$_1$); Analyzed value: C, 83.16%, H, 5.93%, N, 7.33%; Calculated value: C, 84.03%, H, 5.82%, N, 7.35%.

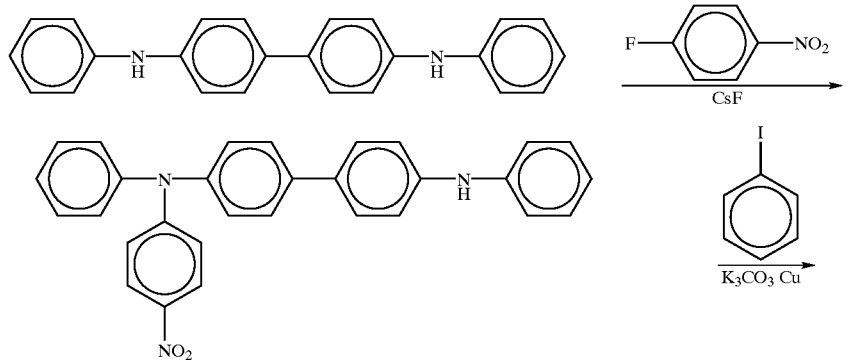

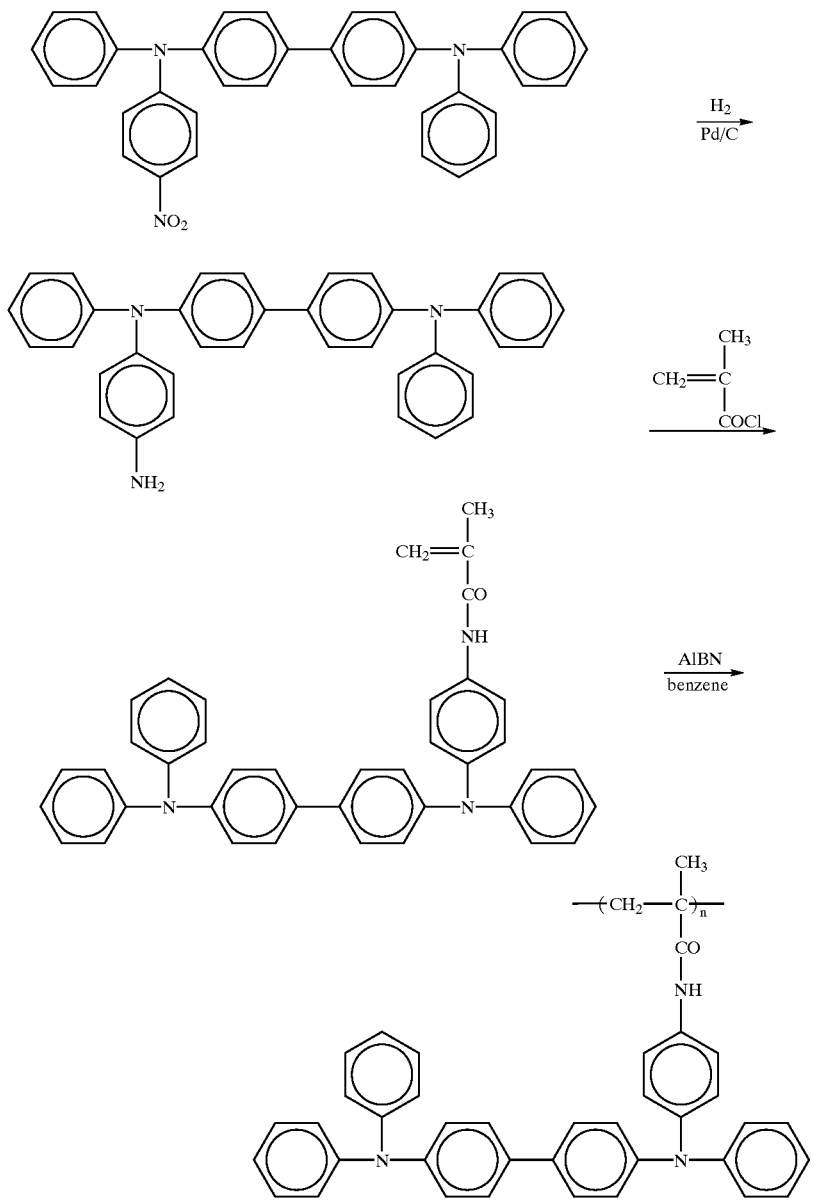

Embodiment 1

(1) No Irradiation

Figure 1:
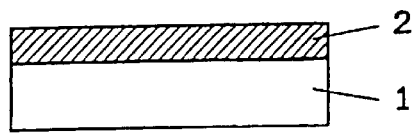
FIG. 1 is a schematic diagram showing a process in (1) to (6) for manufacturing a multicolor organic EL element according to Embodiment 1.
Figure 1:
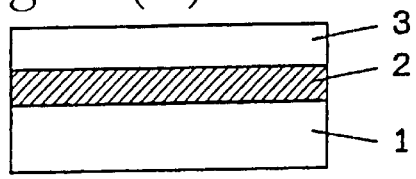
Figure 1:
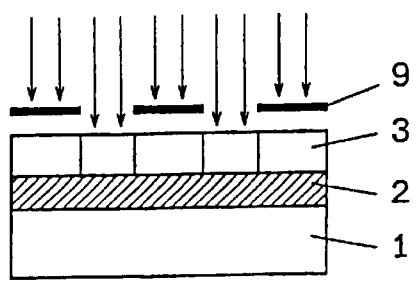
Figure 1:
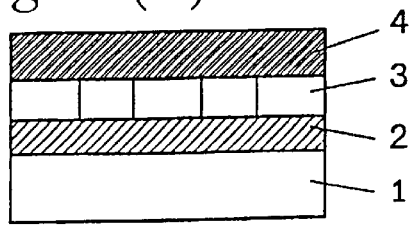
Figure 1:
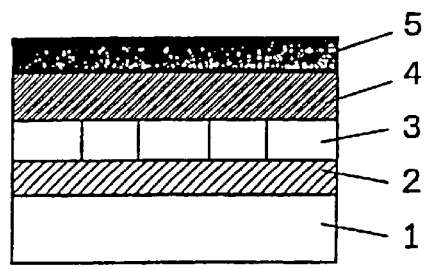
Figure 1:
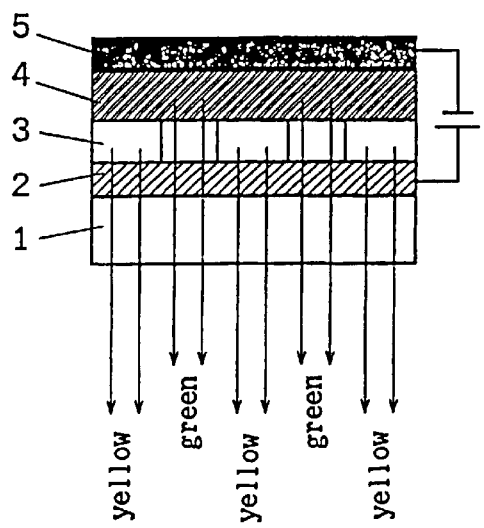

FIG. 1 is a sectional view illustrating a manufacturing process according to one embodiment of this invention. Reference number 1 designates a glass substrate on which ITO (indium-tin oxide) 2 of sheet resistance 15 $\Omega/\square$ is coated. A solution in 1,2-dichloroethane of polymer PTP-DMA synthesized as described above, which has positive transporting capability, emits a blue-purple light, containing 1 wt. %, 3 wt. %, 5 wt. %, or 7 wt. % of rubrene based on the PTPDMA, which emits a yellow light and has the following formula:

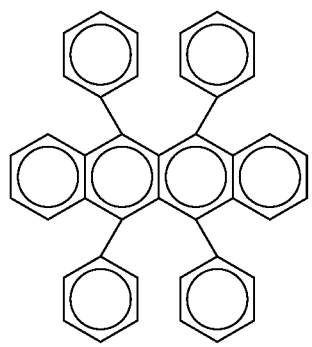

was used to form a polymer layer 3 (rubrene-dispersed PTPDMA layer) of 600 Å thickness on the ITO by means of spin-coating.

A tris(8-quinolinolate)aluminum complex layer (hereafter referred to as Alq) 4 with green emission and expressed by the following formula:

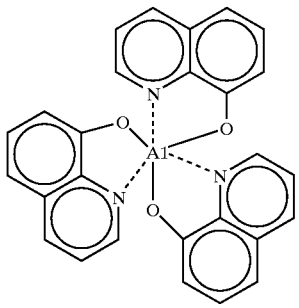

was formed on said polymer layer 3 as an electron transport layer 4 by depositing the material up to 400 Å in a vacuum of $10^{-5}$ Torr. Finally, in the same vacuum, Mg and Ag (10:1) were co-deposited up to 2000 Å as a rear electrode 5, acting as a negative electrode. The light-emitting area was 0.5 cm×0.5 cm.

Figure 2:
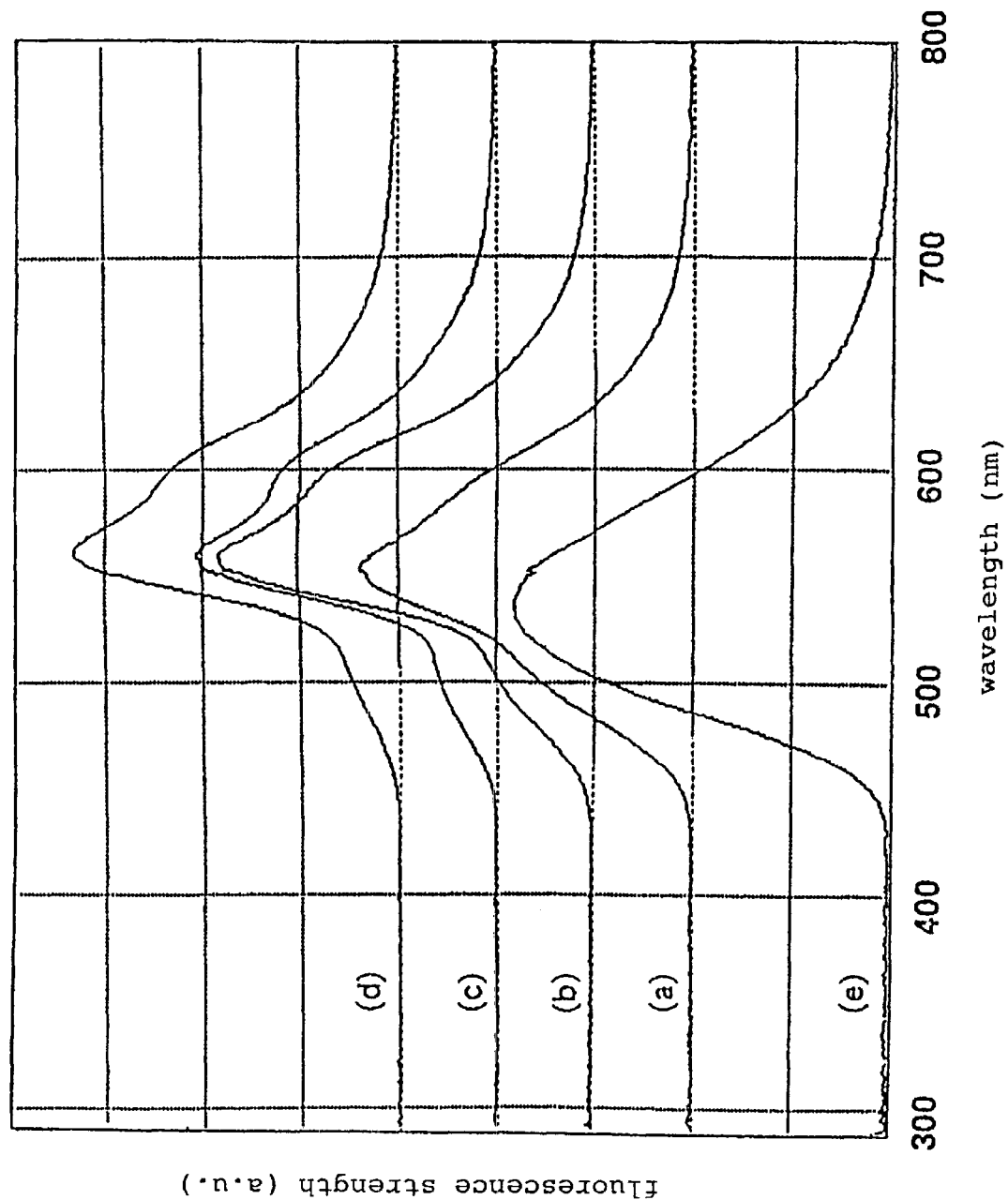
FIG. 2 shows the emission spectra of elements obtained from Embodiments 1(1) and (2).
Figure 3:
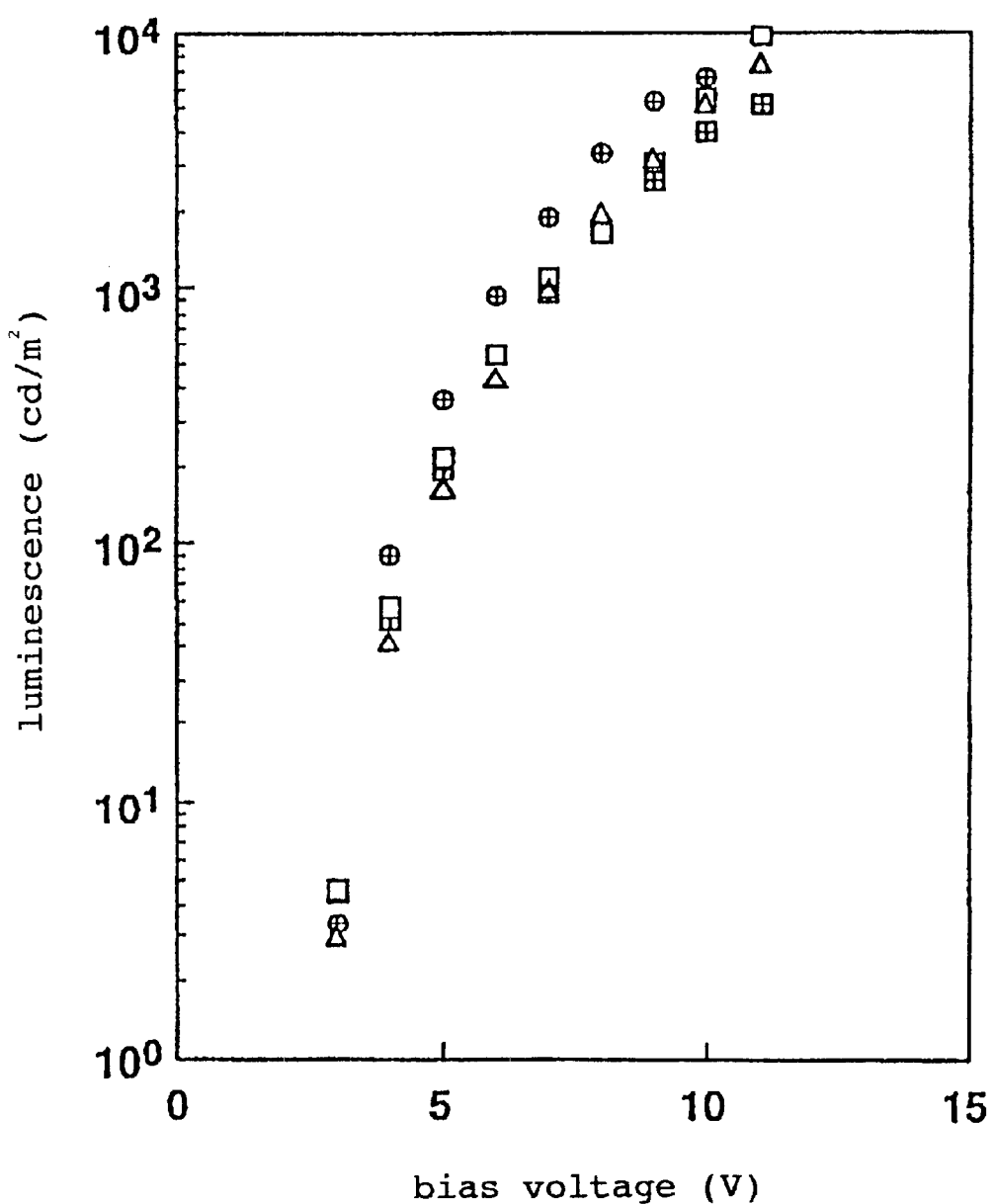
FIG. 3 is a graph showing a luminance-voltage characteristic obtained from Embodiment 1(1).

In these organic EL elements, a direct current voltage was applied to produce emission from the light emitting layer, using ITO and Mg:Ag, respectively, as positive and negative electrodes. The luminescence was measured using Topcon Luminescence Meter BM-8. Yellow emission from this element was observed through a glass surface. Emission spectra obtained from the elements containing 1 wt. %, 3 wt. %, 5 wt. %, and 7 wt. % of rubrene shown in FIGS. 2(a), (b), (c), and (d), respectively, indicate that the rubrene dispersed in PTPDMA functions as a light emitting center (a luminescence center) in this element structure. FIG. 3 shows the luminescence-voltage characteristic obtained (in the figure, the triangular symbol indicates 1 wt. % of rubrene, the rectangular symbol indicates 3 wt. % of rubrene, the white circular symbol with a cross indicates 5 wt. % of rubrene, and the square symbol with a cross indicates 7 wt. % of rubrene). As an initial characteristic, a yellow emission of up to 900 cd/m² was obtained at 12 V.

(2) Irradiation of the Overall Surface

Next, the polymer layer 3 containing 3 wt. % of rubrene dispersed in polymer was formed on the ITO 2 on the glass substrate 1 up to 600 Å in a similar manner, and the overall surface was irradiated with 240 mJ/cm² of i-line produced by a high-pressure mercury lamp in the air. As in the above elements, the electron transport layer 4 was formed by depositing Alq on the polymer layer 3 up to 400 Å under a vacuum of $10^{-5}$ Torr. In the same vacuum, Mg and Ag (10:1) were co-deposited up to 2000 Å as a rear electrode, which acted as a negative electrode 5. The light-emitting area was 0.5 cm×0.5 cm.

Figure 4:
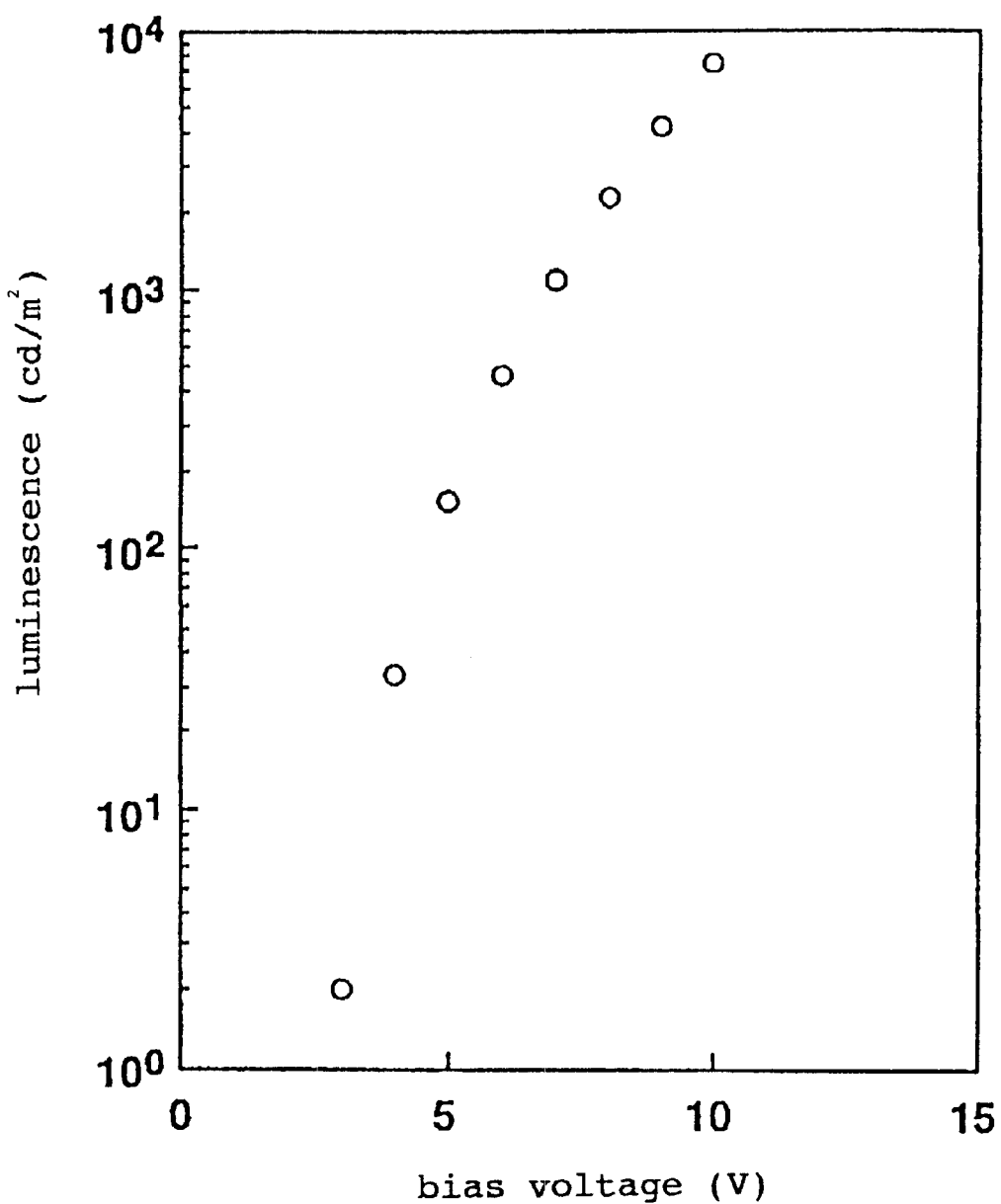
FIG. 4 is a graph showing a luminance-voltage characteristic obtained from Embodiment 1(2).

In this organic EL element, a direct current was applied to produce emission from the light emitting layer, using ITO and Mg:Ag, respectively, as positive and negative electrodes. FIG. 2(e) indicates that the luminescent color was green, and was thus emitted from Alq, and that rubrene did not emit light. FIG. 4 shows the luminescence-voltage characteristic obtained. As an initial characteristic, a green emission of up to 9000 cd/m² was obtained at about 10 V.

(3) Partial Irradiation

Next, the polymer layer 3 containing 3 wt. % of rubrene dispersed in polymer was formed on the ITO 2 on the glass substrate 1 up to 600 Å in a similar manner [see FIG. 1(1) and (2)]. A photo-mask 9 was placed on the polymer surface, and the element was partially irradiated with 240 mJ/cm² of i-line produced by a high-pressure mercury lamp in the air [see FIG. 1(3)]. As in the above element, the electron transport layer 4 was formed by depositing Alq on polymer layer 3 up to 400Å in a vacuum of $10^{-5}$ Torr [see FIG. 1(4)]. Mg and Ag (10:1) were co-deposited up to 2000 Å under the same vacuum with the rear electrode 5, acting as a negative electrode [see FIG. 1(5)]. The light-emitting area was 0.5 cm×0.5 cm.

In this organic EL element, a direct current voltage was applied to produce emission from the light emitting layer, using ITO and Mg:Ag, respectively, as positive and negative electrodes. The unexposed portion emitted a green light, whereas the exposed area emitted a yellow light. This element is a multicolor display element having different luminescent colors on the same substrate (see the photographs included in the submitted documents).

Embodiment 2

(1) No Irradiation

Figure 5:
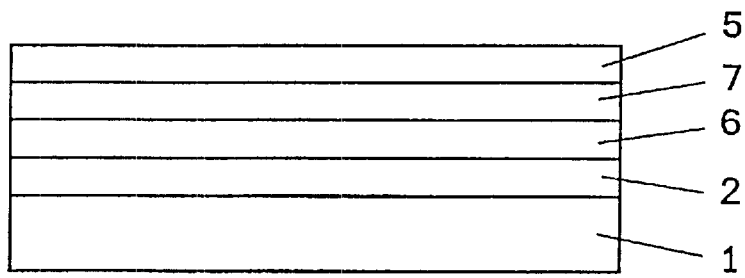
FIG. 5 is a sectional view of an organic EL element according to Embodiment 2.

FIG. 5 is a sectional view of Embodiment 2. Reference number 1 designates a glass substrate on which ITO (indium-tin oxide) 2 of sheet resistance 15 Ω/□ is coated. A positive hole-transport layer 6 was formed on the ITO by depositing N,N'-bis(3-methylphenyl)-1,1'-biphenyl-4,4'-diamine (hereafter referred to as TPD) which has a positive hole transporting capability and has the following formula

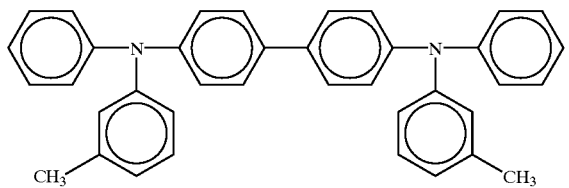

up to 400 Å thickness In a vacuum of $10^{-6}$ Torr. Next, an Alq-rubrene layer 7 was formed as an electron transporting light emitting layer 7 by depositing Alq and rubrene thereon up to 600 Å in a vacuum of $10^{-5}$ Torr., so that the ratio of Alq to rubrene was 97 wt. % and 3 wt. %. Finally, Mg and Ag (10:1) were co-deposited up to 2000 Å under the same vacuum, as a rear electrode 5, acting as a negative electrode. The light-emitting area was 0.5 cm×0.5 cm.

In this organic EL element, a direct current voltage was applied to produce emission from the light emitting layer, using ITO and Mg:Ag, respectively, as positive and negative electrodes. A yellow emission from this element was observed through a glass surface. An emission spectrum obtained from the element indicates that rubrene present in the Alq layer functioned as a light emitting center in this element structure.

(2) Irradiation of the Overall Surface

Next, a layer 6 of thickness 400 Å was formed on the ITO 2 on the glass substrate 1 in the same manner as described above, and an Alq-rubrene layer 7 was formed by co-depositing Alq and rubrene thereon up to 600 Å in a vacuum of $10^{-5}$ Torr., in the same ratio as described above. Then, the overall surface was irradiated with 1200 mJ/cm² of i-line produced by a high-pressure mercury lamp in the air. Mg and Ag (10:1) were co-deposited on the Alq-rubrene layer 7 up to 2000 Å under the same vacuum, as a rear electrode 5, acting as a negative electrode. The light-emitting area was 0.5 cm×0.5 cm.

In this organic EL element, a direct current voltage was applied to produce emission from the light emitting layer, using ITO and Mg:Ag, respectively, as positive and negative electrodes. It was found that the luminescent color was green, indicating emission from Alq and no emission from the rubrene, due to photo-oxidation.

(3) Partial Irradiation

Next, TPD as a layer 6 of thickness 400 Å was formed on the ITO 2 on the glass substrate 1 in the same manner, and an Alq-rubrene layer 7 was formed by co-depositing Alq and rubrene thereon up to 600 Å in a vacuum of $10^{-5}$ Torr., in the same ratio given above. A photo-mask 9 was placed on the polymer surface, and the element was partially irradiated with 1200 mJ/cm$^2$ of i-line produced by a high-pressure mercury lamp in the air. As in the above element, Mg and Ag (10:1) were co-deposited up to 2000 Å under the vacuum as rear electrode 5, acting as a negative electrode. The light-emitting area was 0.5 cm×0.5 cm.

In this organic EL element, a direct current voltage was applied to produce emission from the light emitting layer, using ITO and Mg:Ag, respectively, as positive and negative electrodes. The exposed portion emitted a green light, indicating Alq, whereas the unexposed area emitted a yellow light, indicating rubrene. This element is a multicolor display element having different luminescent colors on the same substrate.

Embodiment 3

(1) No Irradiation

Figure 6:
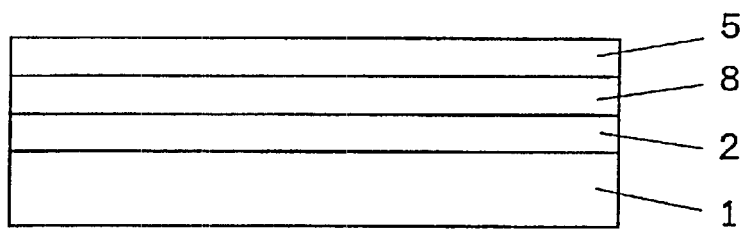
FIG. 6 is a sectional view of an organic EL element according to Embodiment 3.

FIG. 6 is a sectional view of Embodiment 3. Reference number 1 designates a glass substrate on which ITO (indium-tin oxide) 2 of sheet resistance 15 Ω/□ is coated. A 1,2-dichloroethane solution containing 30 wt. % of electron-transporting 1,3,4-oxadiazole (PBD), 5 wt. % of 1,1,4,4-tetraphenyl-1,3-butadiene (hereafter referred to as TPB) that is a blue-light-emitting dye, and 3 wt. % of rubrene, in a poly(N-vinylcarbazole) (PVK) capable of transporting positive holes and having an emission peak in the blue-purple wavelength region (410 to 420 nm) was used to form a polymer film 8 of 1000 Å on the ITP by means of spin-coating. Finally, a layer 5 of Mg and Ag (10:1) was co-deposited up to 2000 Å under the same vacuum as a negative electrode. The light-emitting area was 0.5 cm×0.5 cm.

In this organic EL element, a direct current voltage was applied to produce emission from the light emitting layer, using ITO and Mg:Ag, respectively, as positive and negative electrodes. A yellow emission of up to 2200 cd/m$^2$ was obtained at 16 V as an initial characteristic. Further, from emission spectra, it was confirmed that luminescence center was rubrene.

(2) Irradiation of the Overall Surface

Next, the PVK layer 8 containing 30 wt. % of PBD, 5 wt. % of TPB, and 3 wt. % of rubrene was formed on the ITO 2 on the glass substrate 1 as described above, and the overall surface was irradiated with 120 mJ/cm$^2$ of i-line produced by a high-pressure mercury lamp in the air. Mg and Ag (10:1) were co-deposited on the polymer layer 8 up to 2000 Å in an identical vacuum, as a rear electrode 5, acting as a negative electrode. The light-emitting area was 0.5 cm×0.5 cm.

In this organic EL element, a direct current was applied to produce emission from the light emitting layer, using ITO and Mg:Ag, respectively, as positive and negative electrodes. It was found that the luminescent color was blue, and thus produced by TPB, and that rubrene did not emit light due to photo-oxidation.

(3) Partial Irradiation

Next, the PVK layer 8 containing 30 wt. % of PBD, 5 wt. % of TPB, and 3 wt. % of rubrene was formed on the ITO 2 on the glass substrate 1 in the same manner as described above. A photo-mask 9 was placed on the polymer surface, and the element was partially irradiated with 120 mJ/cm$^2$ of i-line produced by a high-pressure mercury lamp in the air. Mg and Ag (10:1) were co-deposited on the polymer layer 8 up to 2000 Å under identical vacuum, as the rear electrode 5, acting as a negative electrode. The light-emitting area was 0.5 cm×0.5 cm.

In this organic EL element, a direct current voltage was applied to produce emission from the light emitting layer, using ITO and Mg:Ag, respectively, as positive and negative electrodes. The exposed portion emitted blue light, indicating TPB, whereas the unexposed area emitted yellow light, indicating rubrene. This element is a multicolor display element having different luminescent colors on the same substrate.

Embodiment 4

(1) (Control)

FIG. 7 is a sectional view of an embodiment of this invention. Reference number 21 designates a glass substrate on which ITO (indium-tin oxide) 22 of sheet resistance 15 Ω/□ is coated. A 1,2-dichloro-ethane solution containing in poly (N-vinylcarbazole) (hereafter referred to as PVK) capable of transporting positive holes, having a blue-purple emission, and expressed by the following formula

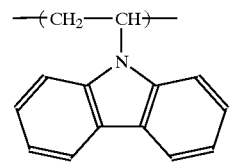

30 wt. % of 1,3,4-oxadiazole derivative (PBD) capable of transporting electrons and expressed by the following formula

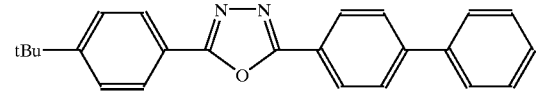

3 mol % of 1,1,4,4-tetraphenyl-1,3-butadiene (TPB), a blue color dye acting as a dopant dye, 1 mol % of coumarin 6 having green emission, and 1 mol % of Nile Red having red emission were used to form a dye-containing polymer film up to 1000 Å by means of spin-coating. Then, Mg and Ag (10:1) were co-deposited up to 2000 Å under the same vacuum, as a rear electrode 5, acting as a negative electrode. The light-emitting area was 0.5 cm×0.5 cm.

In this organic electroluminescent element, a direct current voltage was applied to produce emission from the light emitting layer, using ITO and Mg:Ag, respectively, as positive and negative electrodes. A red emission from this element was observed through a glass surface. Thus, it was found that in this element structure, the energy transfer between dopant dyes caused the energy of the dyes to transfer to Nile Red with the lowest excitation energy unit, thereby allowing only Nile Red to function as a light emitting center. This result was the same as In the reported elements (J. Kido, H. Shionoya and K. Nagai, Appl. Phys. Lett. 67, 2281 (1995)).

(2) (Control)

In a similar manner, a dye-dispersed PVK layer was formed on the ITO on the glass substrate up to 1000 Å, and a high-pressure mercury lamp was then used to irradiate the layer with light corresponding to an absorption band of Nile Red, through a filter in the air, thereby subjecting only Nile Red to photo-oxidation to make it non-luminescent. Then, Mg and Ag (10:1) were co-deposited on the polymer layer up to 2000 Å under the same vacuum, as a rear electrode acting as a negative electrode. In this organic EL element, a direct current voltage was applied to produce emission from the light emitting layer, using ITO and Mg:Ag, respectively, as positive and negative electrodes. It was found that the luminescent color was green, thus emitted from coumarin 6, and that Nile Red did not emit light.

(3) (Control)

In a similar manner, a dye-dispersed PVK layer was formed on the ITO on the glass substrate up to 1000 Å, and a high-pressure mercury lamp was then used to irradiate the layer with light corresponding to an absorption band of Nile Red, through a filter in the air. Then, the filter was changed to irradiate the layer with light corresponding to an absorption band of coumarin 6, thereby subjecting both Nile Red and coumarin 6 to photo-oxidation to render them non-luminescent. Mg and Ag (10:1) were then co-deposited on the polymer layer up to 2000 Å under the Identical vacuum, as a rear electrode, acting as a negative electrode. In this organic EL element, a direct current voltage was applied to produce emission from the light emitting layer, using ITO and Mg:Ag, respectively, as positive and negative electrodes. It was found that the luminescent color was blue, and thus emitted from TPB, and that coumarin 6 or Nile Red did not emit light.

(4) (The Present Invention)

Figure 9:
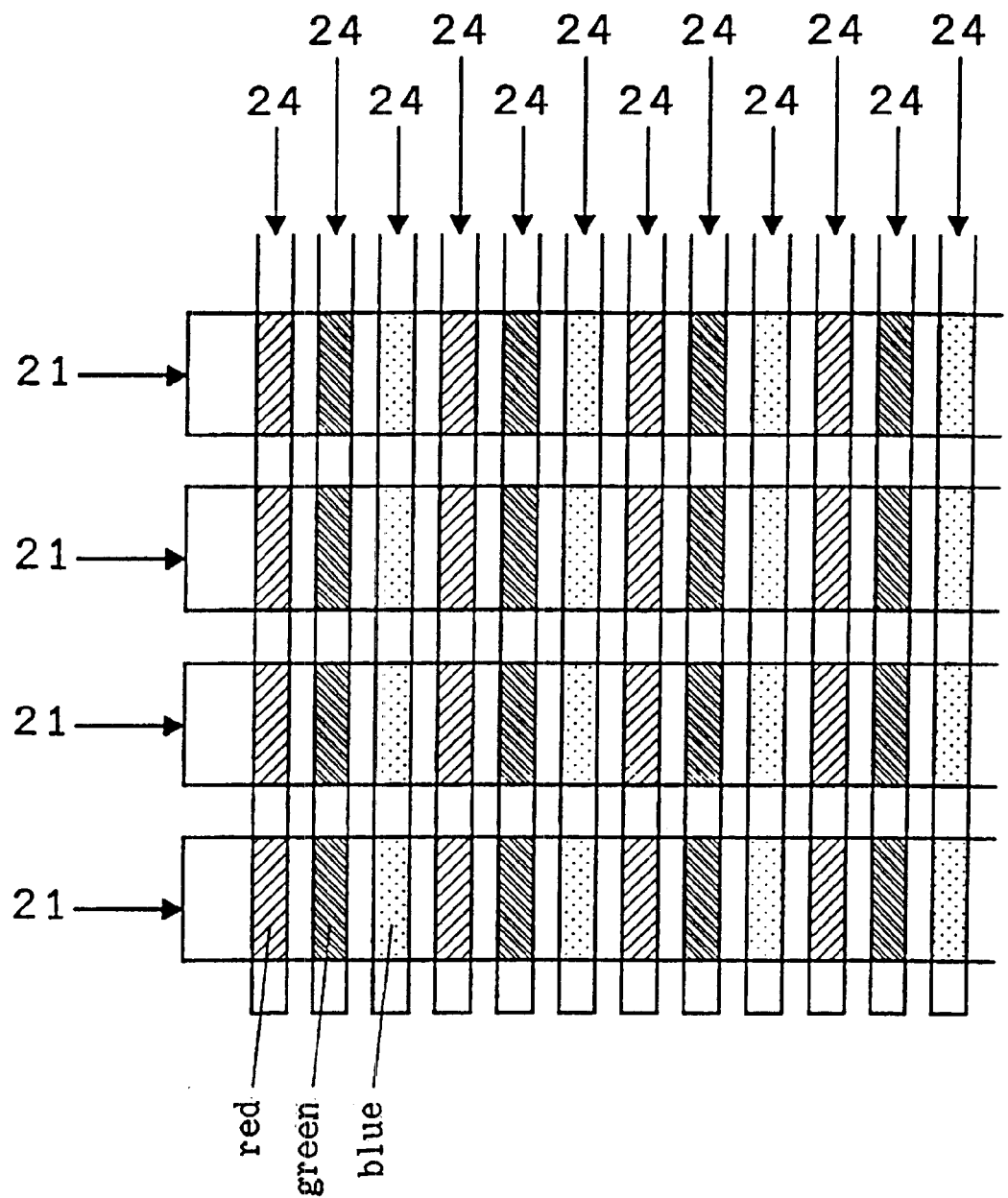
FIG. 9 is a simplified view of an organic EL element according to Embodiment 4, as seen from a glass substrate.

Next, 16 striped ITO electrodes (shown at 22) of width 3 mm were arranged on the glass substrate 21 in parallel at equal intervals (see FIGS. 8 and 9), and a dye-dispersed PVK layer 23 was formed up to 1000 Å in a similar manner (FIG. 8B). Then, a photo-mask was placed on the polymer surface, and a high-pressure mercury lamp was used to irradiate two-thirds of the entire area of the PVK layer 23 with light through a filter in such a way that the layer was illuminated in stripes at an equal interval, thereby modifying only Nile Red (FIG. 8C). Subsequently, one half of the area of the PVK layer 23 in which Nile Red had been modified using the photo-mask was irradiated with light in stripes in order to modify coumarin (FIG. 8D). Forty-eight striped Mg:Ag electrodes (shown at 24) of width 1 mm were deposited in such a way as to cross the ITO electrodes to form a matrix display element (FIGS. 8E and 9). A direct current voltage was applied to this element using ITO and Mg:Ag, respectively, as positive and negative electrodes. Red, green, and blue light was observed through a glass substrate. In addition, an image consisting of R, G, and B could be displayed by using ITO as a scanning electrode and Mg:Ag as a signal electrode to cause each picture element to emit light by means of time-sharing driving.

With respect to the drive method, an active element such as a transistor may be added to each picture element of an RGB multicolor element to perform a memory function, thereby providing an active-matrix RGB dot-matrix display, or a full-color display.

What is claimed is:

1. A method for manufacturing a multicolor organic EL element, comprising:

forming a light emitting layer containing at least two organic pigments that can act as light emitting center; and irradiating partly the light emitting layer with electromagnetic waves so as to modify at least one of said organic pigments, change colors of light emitted from at least one of said organic pigments, and enable a plurality of colors of light to be emitted from said light emitting layer.

2. A method for manufacturing a multicolor organic EL element having one or more light emitting layers containing organic pigments that can act as light emitting center, the method comprising:

irradiating entirely or partly the surface of an arbitrary light emitting layer with electromagnetic waves so as to modify at least one of said organic pigments present in the irradiated area, change colors of light emitted from at least one of said pigments, and enable a plurality of colors of light to be emitted from the irradiated light emitting layer.

* * * * *